US006949952B2

(12) United States Patent
Mecier et al.

(10) Patent No.: US 6,949,952 B2
(45) Date of Patent: Sep. 27, 2005

(54) PROGRAMMING CIRCUIT AND METHOD HAVING EXTENDED DURATION PROGRAMMING CAPABILITIES

(75) Inventors: Richard A. Mecier, Boise, ID (US); Charles L. Ingalls, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/968,446

(22) Filed: Oct. 18, 2004

(65) Prior Publication Data

US 2005/0077916 A1 Apr. 14, 2005

Related U.S. Application Data

(63) Continuation of application No. 10/165,666, filed on Jun. 6, 2002, now Pat. No. 6,836,145.

(51) Int. Cl.[7] .................. H03K 19/173; H03K 19/0175
(52) U.S. Cl. .......................... 326/38; 327/390; 327/525; 365/96; 326/88
(58) Field of Search ............................. 326/88, 92, 38; 27/390; 327/589, 525, 536; 365/96, 225.7

(56) References Cited

U.S. PATENT DOCUMENTS

| 5,495,436 | A | 2/1996 | Callahan ....................... 365/96 |
| 5,572,458 | A | 11/1996 | Smith et al. ................... 365/96 |
| 5,604,694 | A | 2/1997 | Callahan ....................... 365/96 |
| 5,656,949 | A | 8/1997 | Yip et al. ...................... 326/38 |
| 5,687,116 | A | 11/1997 | Kowshik et al. ........ 365/185.03 |
| 5,844,298 | A | 12/1998 | Smith et al. ................. 257/530 |
| 5,896,041 | A | 4/1999 | Sher et al. ..................... 326/38 |
| 6,043,536 | A | 3/2000 | Numata et al. ............. 257/347 |
| 6,208,570 | B1 | 3/2001 | Brown et al. ............... 365/201 |
| 6,240,033 | B1 | 5/2001 | Yang et al. .............. 365/225.7 |
| 6,363,008 | B1 | 3/2002 | Wong .................... 365/185.03 |
| 6,388,478 | B1 | 5/2002 | Mann .......................... 327/113 |
| 6,438,462 | B1 | 8/2002 | Hanf et al. .................. 700/297 |
| 6,486,728 | B2 | 11/2002 | Kleveland .................... 327/536 |
| 6,496,027 | B1 | 12/2002 | Sher et al. ................... 324/763 |
| 6,525,955 | B1 | 2/2003 | Smith et al. .................. 365/96 |
| 6,541,792 | B1 | 4/2003 | Tran et al. ..................... 257/50 |
| 6,552,587 | B2 | 4/2003 | Kim et al. ................... 327/158 |
| 6,693,819 | B2 | 2/2004 | Smith et al. ................. 365/154 |
| 6,836,145 | B2 * | 12/2004 | Mecier et al. ................. 326/38 |

* cited by examiner

Primary Examiner—Daniel Chang
(74) Attorney, Agent, or Firm—Dorsey & Whitney LLP

(57) ABSTRACT

An isolation circuit for coupling a large programming voltage from an external terminal to a circuit ground node includes an NMOS isolation transistor through which the programming voltage is coupled, and a charge pump that applies a voltage having at least the magnitude of the programming voltage to the gate of the NMOS transistor. As a result, the NMOS transistor is able to pass the full magnitude of the programming voltage to the circuit ground node. The charge pump can generate a voltage having a sufficient magnitude with only a single charge pump stage because the charge pump uses the relatively large programming voltage as the starting point for the voltage boosting process.

57 Claims, 4 Drawing Sheets

PROGRAMMING CIRCUIT AND METHOD HAVING EXTENDED DURATION PROGRAMMING CAPABILITIES

CROSS-REFERENCE TO RELATED APPLICATION

This application is a continuation of U.S. patent application Ser. No. 10/165,666, filed Jun. 6, 2002 now U.S. Pat. No. 6,836,145.

TECHNICAL FIELD

The present invention relates to programming programmable elements such as anti-fuses used in integrated circuits, and more particularly to a method and apparatus for coupling an externally applied, relatively large programming voltage to programmable elements for a sufficient duration to allow sequentially programming a large number of the programmable elements.

BACKGROUND OF THE INVENTION

Programmable elements such as anti-fuses are a common component in conventional integrated circuits. An anti-fuse is a circuit element that is normally open circuited until it is programmed at which point the anti-fuse assumes a relatively low resistance. Anti-fuses are commonly used to selectively enable certain features of integrated circuits and to perform repairs of integrated circuits. Features of integrated circuits are selected by, for example, "blowing" anti-fuses in a mode register to generate signals that alter the operation of the integrated circuit. Repairs of integrated circuits are typically accomplished by blowing anti-fuses to signal defective portions of the integrated circuit that they should be replaced with redundant circuits. For example, a defective row of memory cells in the array of a dynamic random access memory can be replaced with a redundant row of cells provided for that purpose.

Conventional anti-fuses are similar in construction to capacitors in that they include a pair of conductive plates separated from each other by a dielectric or insulator. Anti-fuses are typically characterized by the nature of the dielectric, which may be, for example, oxide or nitride. Anti-fuses are programmed or "blown" by applying a differential voltage between the plates that is sufficient to break down the dielectric thereby causing the plates to contact each other. Typically at least one voltage used to provide this differential voltage is applied to the chip externally through terminals that are normally used for other purposes. For example, in a dynamic random access memory ("DRAM") device, a high voltage may be applied to one of the data bit terminals after the integrated circuit has been placed in a programming mode by, for example, applying a predetermined combination of bits to other terminals of the integrated circuit.

Although conventional anti-fuses as described above have worked well in many applications, their use nevertheless may create several problems, particularly when used in more recent, high-density integrated circuits. In particular, the programmed resistance of anti-fuses varies over a considerable range, and the programmed resistance may be far higher than is desired. For example, the programmed resistance may be high enough that circuitry connected to the anti-fuse mistakenly determines that the anti-fuse is open circuited. It is generally known that programming anti-fuses with a higher current will both lower the programmed resistance and provide a more uniform resistance. However, the magnitude of the programming voltage that can be applied to anti-fuses is severely limited by the presence of other circuitry in the integrated circuit. In particular, since the terminals on which the programming voltage is applied are typically used for other functions, excessive programming voltages can easily break down the gate oxide layers of MOSFET transistors connected to such terminal thereby making such transistors defective.

Excessive programming voltages can also exceed the breakdown voltage of bipolar transistors that are connected to the input terminals of integrated circuits to provide electrostatic discharge ("ESD") protection for the remaining components of the integrated circuit. While this problem can be alleviated to some extent by increasing the breakdown voltage of the bipolar ESD protection transistors, doing so may reduce the safety margin of the ESD protection. While the problem of breaking down gate oxide layers of MOSFET transistors and exceeding the breakdown voltage of bipolar ESD protection transistors could be alleviated to some extent by using dedicated terminals to program anti-fuses, doing so would further increase the already large number of terminals required for many semiconductor devices, such as DRAM devices. Furthermore, the problem would nevertheless remain because it would be difficult to isolate the programming voltage from the integrated circuit substrate. Failure to isolate the programming voltage from the substrate could cause excessive voltages to be coupled across the gate oxide layers of MOSFET transistors, even though the programming voltage was not applied directly to the gates of the transistors.

The problem of programming voltages breaking down the gate oxide layer of MOSFET's is exacerbated by the wide range of operating voltages of typical integrated circuits. For example, recent integrated circuits are capable of operating with a supply voltage of 1.8 volts in order to minimize power consumption, but they must still be able to operate with a commonly used supply voltage of 3.3 volts.

The limited magnitude of programming voltages that can be applied to external terminals make it important to couple substantially all of the programming voltage to the anti-fuses that are to be programmed. However, since at least one voltage used to provide the differential programming voltage is generally applied through an external terminal that is also used for other purposes, an isolation circuit must be provided between the terminal and the anti-fuse. A MOSFET transistor is often used as an isolation circuit. For example, an NMOS isolating transistor can be used to couple a positive programming voltage to one plate of the anti-fuse. However, for the NMOS isolating transistor to pass the entire magnitude of the programming voltage, a positive voltage having a magnitude that is greater than the magnitude of the programming voltage must be applied to the gate of the NMOS isolating transistor. In fact, the voltage applied to the gate of the NMOS isolating transistor must exceed the positive programming voltage by a threshold voltage $V_T$ for the transistor to couple the full magnitude of the programming voltage to the anti-fuse. If a lesser voltage is applied to the gate of the NMOS isolating transistor, the voltage applied to the anti-fuse will be no greater than the voltage applied to the gate less the threshold voltage $V_T$.

Several techniques have been used to apply a voltage to the gate of an NMOS isolation transistor that is $V_T$ larger than an externally applied programming voltage. One conventional approach is to use a "bootstrap" circuit, such as a capacitor coupled between the gate of the NMOS isolation transistor and a terminal of the transistor that is coupled to the anti-fuse. The capacitor can be either a discrete capacitor external to the isolation transistor or a parasitic capacitance internal to the isolation transistor. The bootstrap capacitor is charged to at least a relatively small positive bias voltage $V_B$ before the isolation transistor is turned ON. When the bootstrap transistor is turned ON, the voltage on the terminal of the transistor that is coupled to the anti-fuse increases, and this increase is coupled to the gate of the transistor through the capacitor. The voltage on the gate of the transistor thus increases to substantially the sum of the programming voltage and the bias voltage $V_B$, thereby allowing the NMOS isolating transistor to couple the entire magnitude of the programming voltage to the anti-fuse.

A significant limitation on the use of a bootstrap capacitor is the limited duration in which the voltage applied to the gate of the isolation transistor remains above the programming voltage by at least the threshold voltage $V_T$. More specifically, when the isolation transistor is initially turned ON, the voltage applied to the gate of the isolation transistor will be $V_P+V_B$, where $V_P$ is the programming voltage and $V_B$ is the bias voltage, which is assumed to be greater than the threshold voltage $V_T$. However, as the charge on the capacitor leaks away, both internally and through external circuit components, the voltage applied to the gate of the isolation transistor decreases. In fairly short order, the capacitor discharges to the point where the voltage applied to the gate of the transistor is less than $V_P+V_T$. Thereafter, the isolation transistor can no longer couple the full magnitude of the programming voltage to the anti-fuse. Programming of additional anti-fuses can then require repetitive cycles of turning OFF the isolation transistor, re-charging the bootstrap capacitor, and again turning ON the isolation transistor. The time required to perform these multiple cycles can unduly increase the time required to program anti-fuses used in semiconductor devices.

Another conventional approach is to provide a semiconductor device using anti-fuses with a charge pump that generates a "supervoltage" having a magnitude that is larger than the sum of the programming voltage and the threshold voltage $V_T$. The supervoltage is applied to the gate of the NMOS isolation transistor to couple the programming voltage to the anti-fuse. Since the supervoltage exceeds the programming voltage by at least the threshold voltage $V_T$, the entire magnitude of the programming voltage can be applied to the anti-fuse.

The use of a charge pump avoids the problem of being able to couple the programming voltage to the anti-fuse for only a limited duration. However, it has the disadvantage of requiring a relatively large number of components in the charge pump, thereby increasing the cost of semiconductor devices using this approach. In particular, the amount of circuitry that must be used in the charge pump is a function of the number of voltage boosting stages contained in the charge pump. Since a relatively large number of voltage boosting stages are required to generate a supervoltage having a large magnitude, a large number of components must be used in the charge pump to generate a sufficiently large supervoltage.

Although these conventional isolation circuits have been explained in the context of applying a positive programming voltage to an anti-fuse through an NMOS isolating transistor, it will be understood that the same or similar problem may exist when applying a negative programming voltage to an anti-fuse through a PMOS transistor. Also, although the isolation circuits have been described as being coupled to an anti-fuse, it will be understood that the same or similar problem may exist when applying a programming voltage to other types of programmable elements, such as fuses.

There is therefore a need for an isolation circuit that uses relatively few components yet is capable of coupling substantially the entire magnitude of a programming voltage to an anti-fuse or other programmable element for an extended duration.

SUMMARY OF THE INVENTION

A charge pump according to the invention is used to supply a relatively large voltage to the control terminal of an isolation device, such as the gate of a MOSFET transistor, that couples a circuit ground node to an external terminal of an integrated circuit. A relatively large programming voltage is applied to the external terminal to allow one or more programmable element coupled to the circuit ground node to be programmed. At other times, the isolation device isolates the external terminal from the circuit ground node so that the external terminal can be used for other purposes. The charge pump generates the relatively large voltage by boosting the programming voltage so that relatively few boosting stages are required in the charge pump. The charge pump also preferably includes a precharge circuit to quickly apply a voltage to the control terminal of the isolation device when a programmable element is to be programmed. When the isolation device is not coupling the external terminal to the circuit ground, a grounding circuit maintains the circuit ground node at a predetermined voltage, such as ground potential.

DETAILED DESCRIPTION OF THE INVENTION

Figure 1:
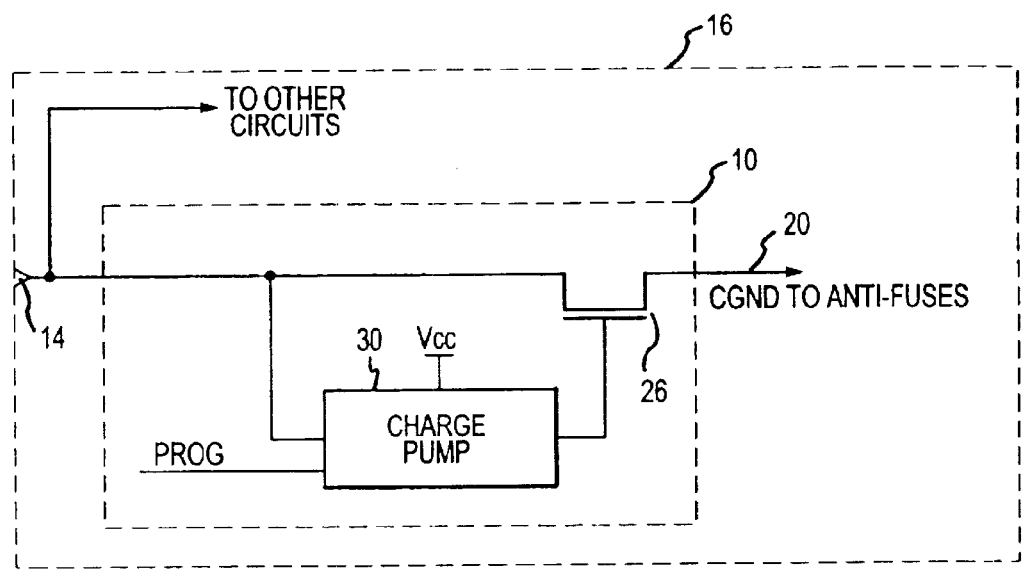
FIG. 1 is a block diagram of one embodiment of an isolation circuit according to the present invention.

An isolation circuit 10 according to one embodiment of the invention is shown in FIG. 1. The isolation circuit 10 is coupled between an external terminal 14 of an integrated circuit 16 and a circuit ground CGND node 20 in the integrated circuit 16. The integrated circuit 16, which may be any of a variety of devices, such as a DRAM device, includes other circuitry (not shown) that are also coupled to the external terminal 14. The isolation circuit 10 functions to isolate the CGND node 20 from this other circuitry so that the CGND node, and anti-fuses (not shown) or other components coupled thereto (not shown) do not interfere with the operation of this circuitry. However, it should be understood that the isolation circuit 10 may be used to isolate the CGND node 20 from a dedicated external terminal (not shown) that is not coupled to any other circuitry.

The isolation circuit 10 includes an NMOS isolating transistor 26 for coupling the CGND node 20 to the external terminal 14. The isolation circuit 10 also includes a charge pump 30 having a first input coupled to the external terminal 14, a second input coupled to received an active high programming command PROG, and an output coupled to the gate of the NMOS isolating transistor 26. The charge pump 30 is powered by a supply voltage $V_{CC}$, which may be, for example, 1.8 volts, 3.3 volts 5 volts or some other voltage. The charge pump 30 preferably includes an internal oscillatoror, or it may alternatively receive a periodic signal from an external oscillator (not shown).

In operation, an inactive low PROG signal causes the charge pump 30 to apply a low voltage, such as zero volts, to the gate of the NMOS isolating transistor 26. As a result, the NMOS isolating transistor 26 is turned OFF to isolate the CGND node 20 from the external terminal 14. When one or more anti-fuses are to be programmed, a relatively large positive programming voltage is applied to the external terminal 14. Suitable circuitry (not shown) in the integrated circuit 16 then causes the PROG signal to transition to an active high. The active high PROG signal enables the charge pump 30 to boost or "pump up" the programming voltage to an output voltage that is higher than the voltage at the external terminal 14, which is applied to the gate of the NMOS isolating transistor 26. The charge pump 30 preferably generates an output voltage that is higher than the magnitude of the programming voltage by at least the magnitude of the threshold voltage $V_T$ of the NMOS isolating transistor 26. As a result, the NMOS isolating transistor 26 is able to couple to the CGND node 20 the full magnitude of the programming voltage applied to the terminal 14.

An advantageous feature of the charge pump 30 is that it is possible to use few components compared to some prior art charge pumps used to couple a large voltage to the gate of an NMOS isolation transistor because the charge pump 30 uses the relatively high external voltage as a starting point to pump up the voltage. The charge pump 30 is able to use relatively few components because it requires relatively few stages since it functions to pump up the programming voltage, which already has a relatively large magnitude. As a result, it may only be necessary for the charge pump 30 to increase the voltage of the programming voltage by the threshold voltage $V_T$ (generally about 0.7 volts) for the isolation transistor 26 to be able to couple the full magnitude of the programming voltage to the CGND node. For example, with a programming voltage of 10 volts, it may only be necessary for the charge pump 30 to increase the programming voltage by 0.7 volts to apply a voltage the gate of the NMOS isolating transistor 26 sufficient to allow it to pass the 10 volt programming voltage. It is generally possible for a charge pump to produce a 0.7 volt increase in an applied voltage with a single charge pump stage even with a supply voltage $V_{CC}$ of 2.5 volts or less. In contrast, a charge pump powered entirely by a supply voltage $V_{CC}$, such as a supply voltage $V_{CC}$ of 2.5 volts, might require 5 charge pump stages to produce a 10.7 volt output. As a result, substantially more components would be required.

The charge pump 30 could alternatively be used to couple a relatively large negative voltage to a PMOS transistor (not shown) in the event the programming voltage applied to the external terminal 14 was a negative voltage. Also, the charge pump 30 could be used to apply a relatively large positive or negative voltage to the control terminal of an isolation device other than to the gate of a MOSFET transistor.

Figure 2:
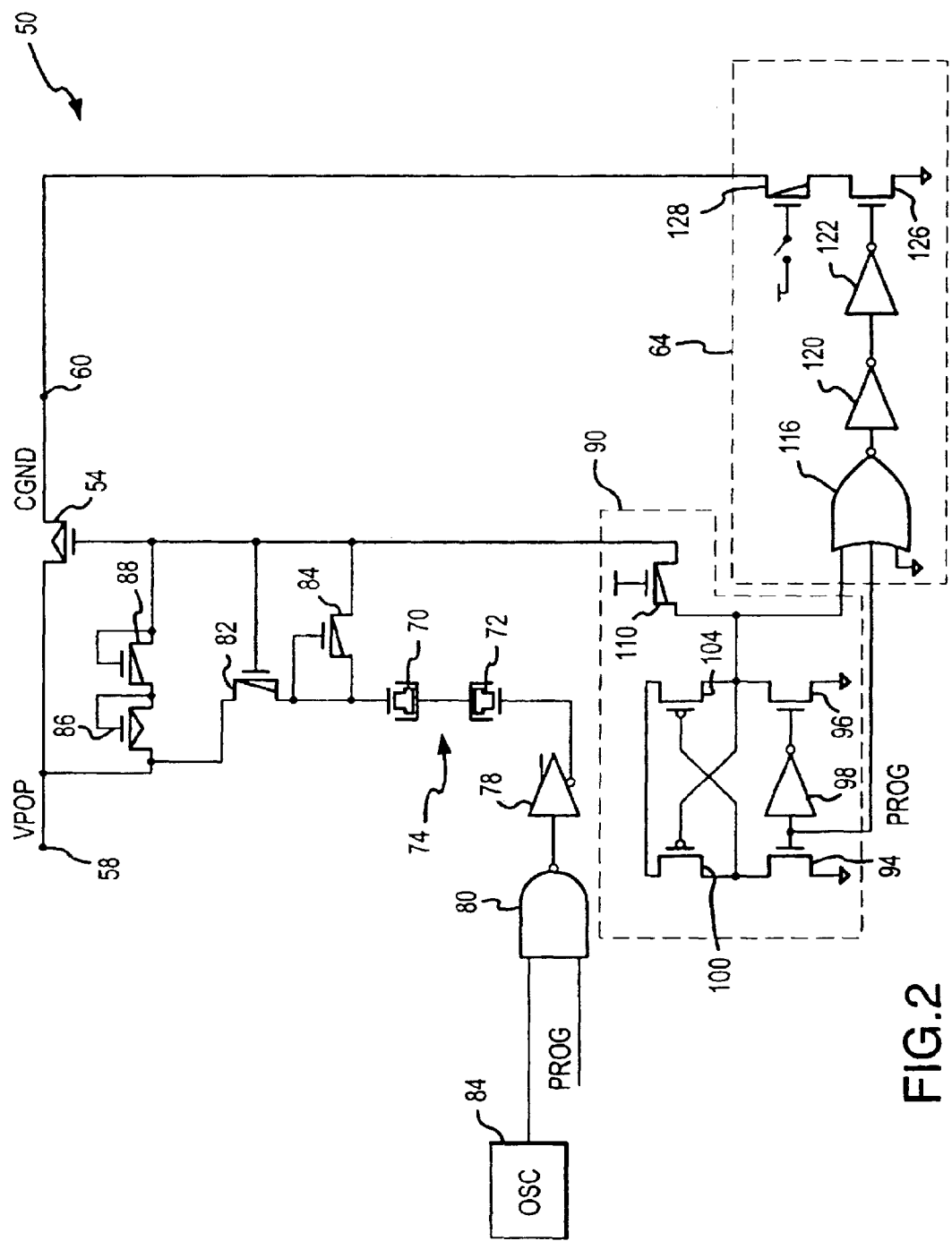
FIG. 2 is a logic diagram and schematic of one embodiment of a charge pump used in the isolation circuit embodiment of FIG. 1.

A charge pump 50 according to one embodiment of the invention is shown in FIG. 2. The charge pump 50, which may be used as the charge pump 30 shown in FIG. 1, is shown coupled to a gate of an NMOS isolation transistor 54. The isolation transistor 54 is coupled between a circuit ground CGND node 60 and an external terminal 58, which may also be coupled to other components (not shown). Also coupled to the CGND node 60 is a grounding circuit 64 that maintains the CGND node at ground potential when the charge pump 50 is not being activated to turn ON the isolation transistor 54.

The charge pump 50 includes a pair of NMOS transistors 70, 72 having their sources and drains coupled to each other to act as a capacitors 74. The gate of the NMOS transistor 72 is coupled to an output of a driver 78, which is, in turn coupled to the output of a NAND gate 80. The driver 78 is preferably powered by a pumped voltage $V_{CCP}$ that has a magnitude greater than a supply voltage $V_{CC}$ that powers other circuits. The pumped voltage $V_{CCP}$ is generated by other circuitry (not shown) fabricated in the integrated circuit in which the charge pump 50 is fabricated. The NAND gate 80 has a first input coupled to receive an active high PROG signal, and a second input coupled to the output of an oscillator 84. In operation, the NAND gate 80 couples a periodic signal from the oscillator 84 to the driver 78 when the PROG signal is active high. The driver 78 then periodically switches the gate of the transistor 72 between ground and the pumped voltage $V_{CCP}$.

The gate of the other capacitor-coupled transistor 70 is coupled to the external terminal 58 through an NMOS charging transistor 82 and to the gate of the isolation transistor 54 by an NMOS discharge transistor 84. The discharge transistor 84 has its gate connected to its drain so that it functions as a diode. Current flows through the charging transistor 82 from the external terminal 58 to charge the capacitor 74 when the driver 78 applies ground potential to the gate of the transistor 72. The capacitor 74 then charges to the magnitude of a programming voltage $V_P$ applied to the external terminal 58 less the threshold voltage $V_{T1}$ of the charging transistor 82, i.e., $V_P-V_{T1}$. When the driver 78 applies the pumped voltage $V_{CCP}$ to the capacitor 74, the voltage applied to the discharge transistor 84 increases to $V_P-V_{T1}+V_{CCP}$. Current then discharges from the capacitor 74 through the discharge transistor 84 with a voltage drop equal to the threshold voltage $V_{T2}$ of the discharge transistor 84. The voltage applied to the gate of the isolation transistor 54 under these conditions will be $V_P+V_{CCP}-V_{T1}-V_{T2}$. As long as $V_{CCP}-V_{T1}-V_{T2}$ is greater than the threshold voltage of the isolation transistor 54, the isolation transistor 54 will be able to couple the full magnitude of the programming voltage $V_P$ to the CGND node 60. Although the capacitor 74 will be discharged when it is applying this boosted voltage to the gate of the isolation transistor 54, the voltage across the capacitor will normally remain sufficiently high for a considerable period so that $V_{CCP}-V_{T1}-V_{T2}$ is greater than the threshold voltage of the isolation transistor 54. The above-described operation is repeated for each cycle of the periodic signal from the oscillator 84.

The charge pump 50 optionally includes at least two diode-coupled NMOS transistors 86, 88 coupled between the gate of the isolation transistor 54 and the external terminal 58. The transistors 86, 88 clamp the voltage applied to the gate of the isolation transistor 54 at a level that is sufficient to allow the full magnitude of the programming voltage $V_P$ to be coupled through the transistor 54 while avoiding the need to drive the gate of the transistor 54 through excessive voltage swings.

When the PROG signal transitions active high, it is important for the charge pump 50 to apply the boosted voltage to the gate of the isolation transistor 54 as soon as possible. For this purpose, a precharge circuit 90 is used to precharge the gate of the isolation transistor 54 to substantially $V_{CCP}$ responsive to the PROG signal transitioning high. The precharge circuit 90 includes a first NMOS transistor 94 receiving the PROG signal and a second NMOS transistor 96 receiving the compliment of the PROG signal through an inverter 98. When PROG is low before a programmable element is to be programmed, the high at the output of the inverter 98 turns ON the transistor 96, which, in turn, causes the transistor 96 to apply a low to a gate of a first PMOS transistor 100. The transistor 100 is then turned ON to apply a voltage of $V_{CCP}$ to the gate of a second PMOS transistor 104, thereby turning the transistor 104 OFF. Since the PMOS transistors have their gates cross-coupled, the precharge circuit 90 will remain in the state described above until the PROG signal transitions active high.

The low at the drain of the transistor 96 is also coupled to the source of an NMOS transistor 110, which is turned ON by a voltage of $V_{CCP}$ applied to its gate. As a result, the gate of the isolation transistor 54 is held low to turn OFF the transistor 54 as long as the PROG signal is inactive low. The transistor 54 then isolates the CGND node 60 from the external terminal 58.

The inactive low PROG signal is also applied to the grounding circuit 64, which grounds the CGND node 60 when the PROG signal is inactive low. The grounding circuit 64 includes a NOR gate 116, which receives the PROG signal and the low at the drain of the second NMOS transistor 96. The NOR gate 116 then outputs a high, which is coupled through two inverters 120, 122 to turn ON an NMOS transistor 126. The NMOS transistor 126 then grounds the CGND node 60 through an NMOS transistor 128, which is turned ON by being biased with a suitable voltage to provide a predetermined impedance between the CGND node 60 and ground. Thus, the CGND node 60 is coupled to ground when the PROG signal is inactive low.

When the PROG signal transitions active high, a number of events simultaneously occur. First, the output of the NOR gate 116 transitions low to turn OFF the transistor 126 in the grounding circuit 64. As a result, the CGND node 60 is no longer coupled to ground.

Second, the high PROG signal turns ON the first NMOS transistor 94, which then turns ON the second PMOS transistor 104. The PMOS transistor 104 then applies a voltage of $V_{CCP}$ to the transistor 110 to precharge the gate of the isolation transistor 54 to a voltage of $V_{CCP}$ less the threshold voltage of the transistor 110. This voltage immediately turns ON the isolation transistor 54, although the voltage applied to the gate of the transistor 54 may not be sufficient to allow the full magnitude of the programming voltage $V_P$ to be coupled through the transistor 54.

Third, the high PROG signal enables the NAND gate 80 so that the driver 78 applies a voltage to the capacitor 74 that varies between ground and the pumped voltage $V_{CCP}$. As previously explained, this causes the gate of the isolation transistor 54 to be driven to a boosted voltage of $V_P+V_{CCP}-V_{T1}-V_{T2}$ thereby allowing the full magnitude of the programming voltage $V_P$ to be coupled from the external terminal 58 to the CGND node 60. However, it may take several periods of the signal from the driver 78 for the capacitor 74 to be fully charged. It is for this reason that the precharge circuit 90 may be important. When the gate of the isolation transistor 54 is at the boosted voltage, the NMOS transistor 110 is turned OFF since the ON PMOS transistor 104 applies a voltage of $V_{CCP}$ to the transistor 110. By turning the transistor 110 OFF, the boosted voltage applied to the gate of the isolation transistor 54 is not clamped to the voltage $V_{CCP}$ that is present on the drain of the PMOS transistor 104.

It is therefore seen that the charge pump 50 isolates the CGND node 60 from the external terminal 58 when the PROG signal is inactive low. When the PROG signal transitions active high, the precharge circuit 90 in the charge pump 50 quickly applies a voltage to the gate of the isolation transistor 54 to turn ON the transistor. Thereafter, the charge pump 50 applies a voltage to the gate of the isolation transistor 54 having sufficient magnitude to allow the transistor 54 to couple to the GCGND node 60 the full magnitude of the programming voltage $V_P$ applied to the external terminal 58, and it does so for a sufficient period to allow a large number of programming elements, such as anti-fuses, to be sequentially programmed. Furthermore, the charge pump 50 is able to accomplish these functions by using relatively few boosting stages because it boosts the programming voltage $V_P$, which already has a large magnitude.

Figure 3:
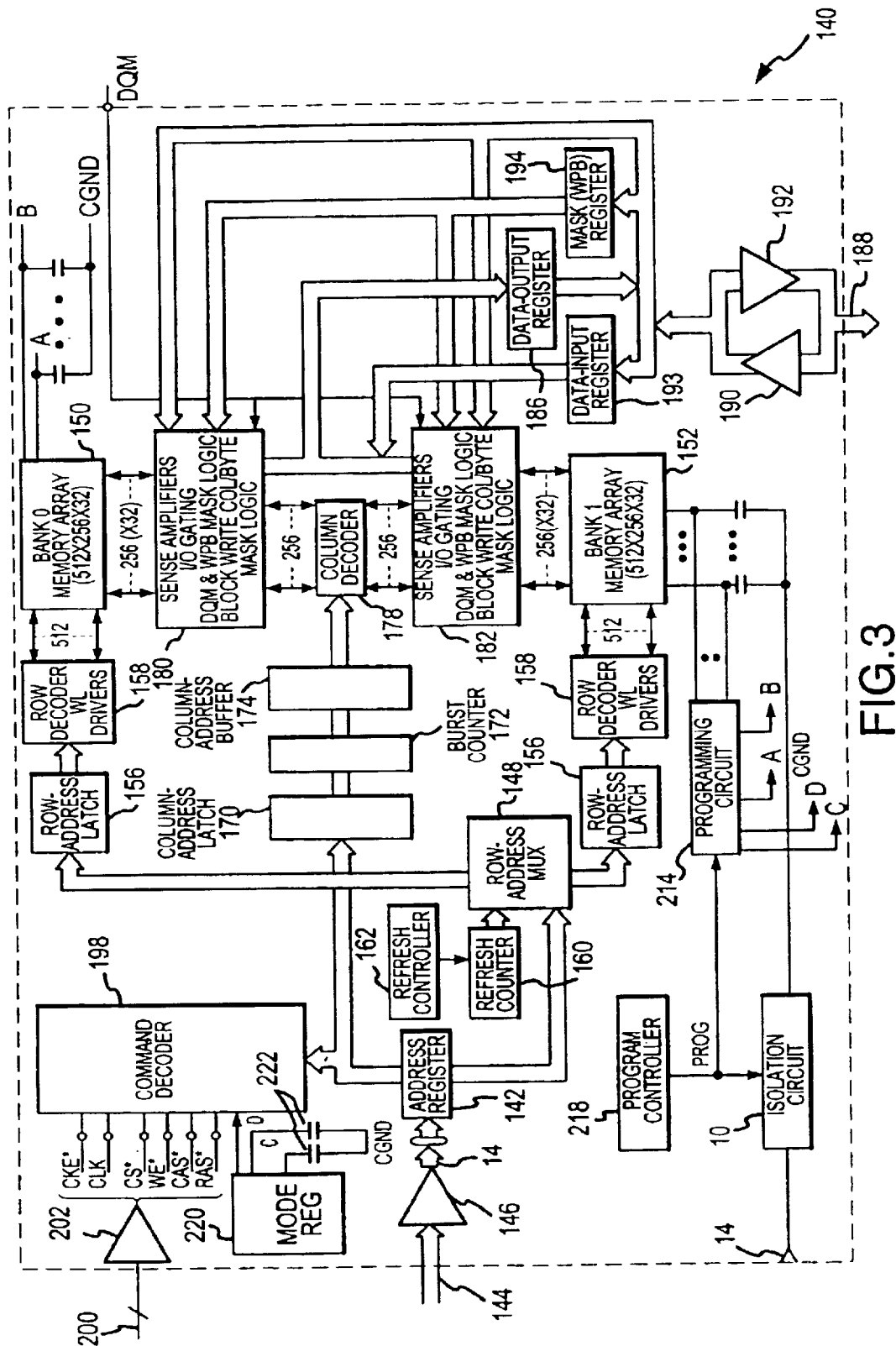
FIG. 3 is a block diagram of one embodiment of a dynamic random access memory device employing the isolation circuit of FIG. 1.

FIG. 3 illustrates a conventional memory device that can advantageously use one or more embodiments of the active termination circuit in according to the present invention. The memory device shown in FIG. 3 is a synchronous dynamic random access memory ("SDRAM") 140, although the active termination circuit may also be used in other memory devices and other integrated circuits. The SDRAM 140 includes an address register 142 that receives either a row address or a column address on an address bus 144 through an address input buffer 146. The address bus 144 is generally coupled to a memory controller (not shown). Typically, a row address is initially received by the address register 142 and applied to a row address multiplexer 148. The row address multiplexer 148 couples the row address to a number of components associated with either of two memory banks 150, 152 depending upon the state of a bank address bit forming part of the row address. Associated with each of the memory banks 150, 152 is a respective row address latch 156, which stores the row address, and a row decoder 158, which applies various signals to its respective memory bank 150 or 152 as a function of the stored row address. The row address multiplexer 158 also couples row addresses to the row address latches 156 to refresh memory cells in the memory banks 150, 152. The row addresses are generated for refresh purposes by a refresh counter 160 that is controlled by a refresh controller 162.

After the row address has been applied to the address register 142 and stored in one of the row address latches 156, a column address is applied to the address register 142. The address register 142 couples the column address to a column address latch 170. Depending on the operating mode of the SDRAM 140, the column address is either coupled through a burst counter 172 to a column address buffer 174, or to the burst counter 172 which applies a sequence of column addresses to the column address buffer 174 starting at the column address that is output by the address register 142. In either case, the column address buffer 174 supplies a column address to a column decoder 178 which applies various column signals to respective sense amplifiers and associated column circuitry 180, 182 for the respective memory banks 150, 152.

Data to be read from one of the memory banks 150, 152 are coupled to the column circuitry 180, 182 for one of the memory banks 150, 152, respectively. The data are then coupled to a data output register 186, which applies the data to a data bus 188 through a data input buffer 190 and a data output buffer 192. Data to be written to one of the memory banks 150, 152 are coupled from the data bus 188 through a data input register 193 to the column circuitry 180, 182 and then are transferred through word line driver circuits in the column circuitry 180, 182 to one of the memory banks 150, 152, respectively. A mask register 194 may be used to selectively alter the flow of data into and out of the column circuitry 180, 182, such as by selectively masking data to be read from the memory banks 150, 152.

The above-described operation of the SDRAM 140 is controlled by a command decoder 198 responsive to high level command signals received on a control bus 200 and coupled to the command decoder through a command input buffer 202. These high level command signals, which are typically generated by a memory controller (not shown in FIG. 3), are a clock enable signal CKE*, a clock signal CLK, a chip select signal CS*, a write enable signal WE*, a column address strobe signal CAS*, and a row address strobe signal RAS*, with the "*" designating the signal as active low or complement. The command decoder 198 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these control signals will be omitted.

The memory banks 150, 152 includes rows of memory cells that are used in normal operation and redundant rows of memory cells that are used to replace defective rows of memory cells. Each redundant row has a respective enable input connected to one plate of a respective anti-fuse 210. This plate of each of the anti-fuses is also coupled to a respective output of a programming circuit 214. The other plate of each anti-fuse 210 is coupled to a common circuit ground CGND node. The CGND node is coupled by the isolation circuit 10 (FIG. 1) to the external terminal 14 to which the programming voltage $V_P$ is applied, as previously explained.

As is well known in the art, the programming circuit 214 outputs a second programming voltage to one of the anti-fuses 210 upon receipt of the active high program command PROG. In its simplest form, the programming circuit 214 may be a connection to an external terminal to which the second programming voltage is applied. The polarity of the second programming voltage provided by the programming circuit 214 is opposite the polarity of the first programming voltage applied to the external terminal 14. Thus, where the first programming voltage applied to the CGND node is positive, the second programming voltage provided by the programming circuit will be negative. The program input PROG is generated by a program controller 218 in a conventional manner when the anti-fuses 210 are to be programmed. Since the program controller 218 is of conventional design, a detailed description has been omitted for purposes of clarity and brevity.

The SDRAM 140 also includes a mode register 220 that is coupled to the command decoder 198. The mode register 220 also includes anti-fuses 222 that are coupled to the CGND node, which, as previously explained, is coupled to the external terminal 14 through the isolation circuit 10. The anti-fuses 222 are also coupled to the programming circuit 214 that functions as also described above. As is well known to those skilled in the art, the anti-fuses 222 are programmed to cause the mode register 220 to apply appropriate signals to the command decoder 198 to program the operating mode of the SDRAM 140.

It will be understood by those skilled in the art that the SDRAM 140 includes a large amount of additional circuitry. However, this additional circuitry has been omitted for purposes of clarity and brevity. Also, although the anti-fuses 210 are shown in FIG. 3 as being used to enable redundant rows of memory cells and the anti-fuses 222 are shown in FIG. 3 as being used to program the mode register 220, it should be understood that isolation circuits according to the invention may also be used to couple programming voltages to other programmable elements, such as fuses (not shown), for other purposes.

Figure 4:
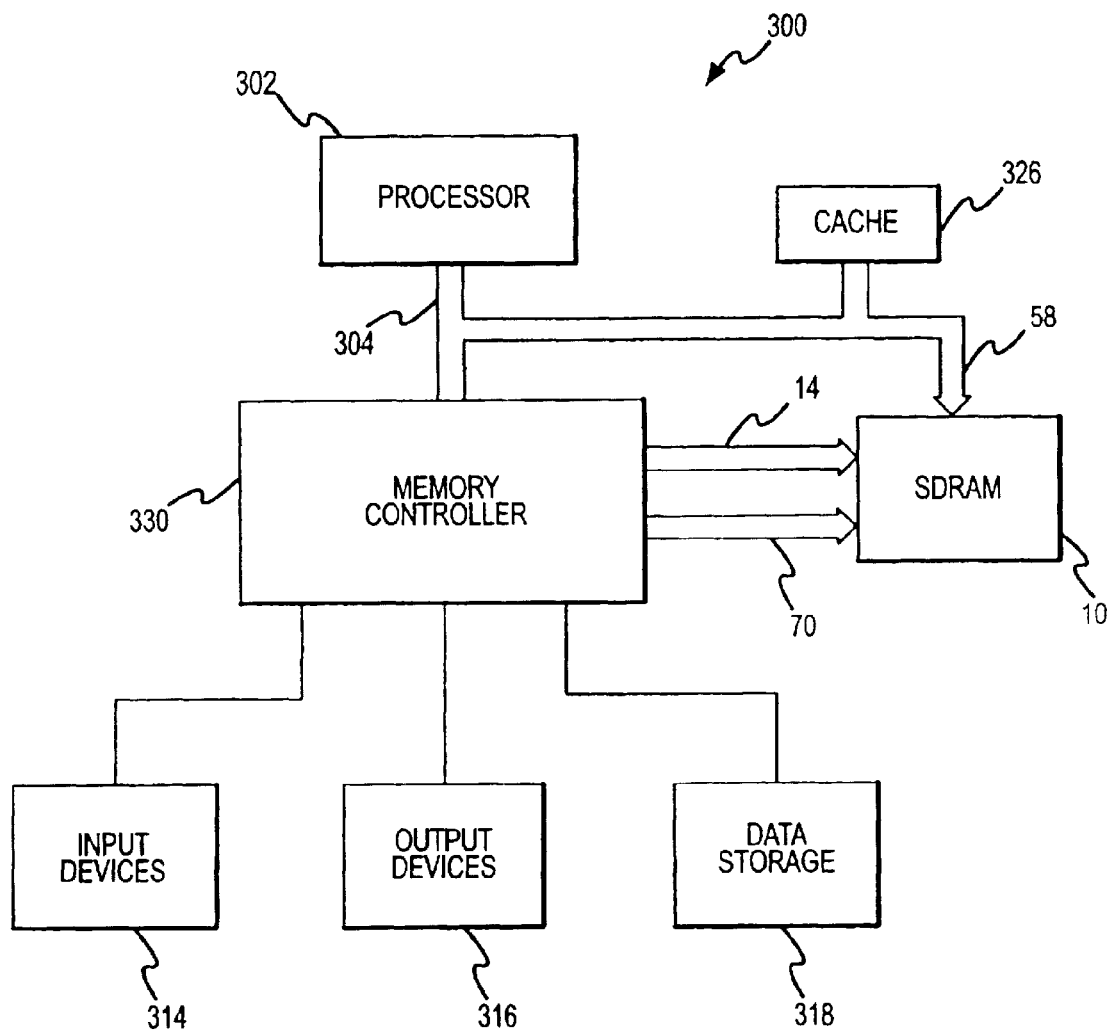
FIG. 4 is a block diagram of a computer system using the dynamic random access memory device of FIG. 3.

FIG. 4 illustrates an example of a computer system 300 using the SDRAM 140 of FIG. 3. The computer system 300 includes a processor 302 for performing various computing functions, such as executing specific software to perform specific calculations or tasks. The processor 302 includes a processor bus 304 that normally includes the address bus 144, the data bus 188, and the control bus 200. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to allow the processor 302 to store data or retrieve data from internal or external storage media (not shown). Examples of typical storage devices 318 include hard and floppy disks, tape cassettes and compact disk read-only memories (CD-ROMs). The processor 302 is also typically coupled to cache memory 326, which is usually static random access memory ("SRAM") and to the SDRAM 10 through a memory controller 330. The memory controller 330 normally includes the control bus 70 and the address bus 14 that is coupled to the SDRAM 140. The data bus 188 may be coupled to the processor bus 304 either directly (as shown), through the memory controller 330, or by some other means. Although the computer system 300 shown in FIG. 4 uses SDRAM memory devices, it will be understood that computer systems may alternatively use other types of memory devices having the isolation circuits according to the present invention.

From the foregoing, it will be appreciated that, although specific embodiments of the invention have been described herein for purposes of illustration, various modifications may be made without deviating from the spirit and scope of the invention. For example, although the embodiments of an isolation circuit explained functions to apply a positive programming voltage to an anti-fuse through an NMOS isolating transistor, it will be understood that they can also be used when applying a negative programming voltage to an anti-fuse through a PMOS transistor or other circuit element. The described embodiments of an isolation circuit may also be used to couple an external terminal to other types of programmable elements, such as fuses. Accordingly, the invention is not limited except as by the appended claims.

What is claimed is:

1. A programming circuit for selectively either isolating a programming node from an external terminal of an integrated circuit or allowing a programming voltage to be coupled from the external terminal to the programming node, the programming circuit comprising:

an isolation device coupled between the external terminal and the programming node, the isolation device having a first terminal coupled to the external terminal, a second terminal coupled to the programming node, and control terminal, the isolation device being operable to couple the programming voltage applied to the external terminal to the programming node as long as the absolute value of the voltage coupled to the programming node is within a predetermined magnitude of a control voltage applied to the control terminal of the isolation device; and a charge pump circuit having a power input coupled to the external terminal and an output terminal coupled to the control terminal of the isolation device, the charge pump circuit being coupled to receive the programming voltage applied to the external terminal and being operable in a program mode to increase the absolute value of the programming voltage in response to a program command signal to generate the control voltage, the charge pump circuit being operable in an isolation mode to generate as the control voltage a voltage having an absolute value that is substantially less than the absolute value of the programming voltage, the charge pump circuit comprising:

a capacitive device having a first lead and a second lead coupled to receive the programming voltage;

a boosting circuit repetitively driving the first lead of the capacitive device between first and second voltage levels responsive to the program command signal; and a uni-directional current path coupling the second lead of the capacitive device to the control terminal of the isolation device.

2. The programming circuit of claim 1 wherein the isolation device comprises a MOSFET transistor.

3. The programming circuit of claim 2, wherein the MOSFET transistor comprises an NMOS transistor.

4. The programming circuit of claim 1 wherein the first current path comprises a MOSFET transistor.

5. The programming circuit of claim 4 wherein the MOSFET transistor comprises an NMOS transistor.

6. The programming circuit of claim 1 wherein the second current path comprises a MOSFET transistor.

7. The programming circuit of claim 6 wherein the MOSFET transistor comprises an NMOS transistor.

8. The programming circuit of claim 1 wherein the capacitive device comprises a MOSFET transistor in which one of the first and second terminals comprises source and drain terminals of the MOSFET transistor and the other of the first and second terminals comprises a gate of the MOSFET transistor.

9. The programming circuit of claim 1, further comprising a precharge circuit coupled to the programming node, the precharge circuit being operable to apply a precharge voltage to the control terminal of the isolation device responsive to the charge pump circuit transitioning to being enabled.

10. The programming circuit of claim 1 wherein the boosting circuit comprises an oscillator applying a periodic signal to the first lead of the capacitive device responsive to the program command signal.

11. A voltage generating circuit for coupling a control voltage to a gate of an isolating transistor having sufficient magnitude to allow a programming voltage applied to an external terminal to be coupled to an output node through the isolating transistor, the voltage generating circuit comprising a charge pump circuit having a power input coupled to receive the programming voltage, the charge pump circuit being operable to increase the absolute value of the programming voltage to generate a voltage applied to the gate of the isolating transistor that has a greater absolute value than the voltage of the programming voltage, the charge pump circuit comprising:

a capacitive device having a first lead and a second lead coupled to receive the programming voltage;

a boosting circuit repetitively driving the first lead of the capacitive device between first and second voltages; and a uni-directional current path coupling the second lead of the capacitive device to the gate of the isolating transistor.

12. The voltage generating circuit of claim 11 wherein the charge pump circuit further comprises a charge path coupled between the external terminal and the second terminal of the capacitive device, the charge path allowing charge current to flow through the charge path only when the boosting circuit is applying the first voltage to the first terminal of the capacitive device.

13. The voltage generating circuit of claim 12 wherein the charge path comprises a MOSFET transistor.

14. The voltage generating circuit of claim 11 wherein the uni-directional current path comprises an diode-coupled transistor.

15. The voltage generating circuit of claim 11 wherein the capacitive device comprises a MOSFET transistor in which one of the first and second terminals comprises source and drain terminals of the MOSFET transistor and the other of the first and second terminals comprises a gate of the MOSFET transistor.

16. The voltage generating circuit of claim 11, further comprising a precharge circuit coupled to the circuit ground node, the precharge circuit being operable to apply a precharge voltage to the gate of the isolating transistor responsive to the charge pump circuit transitioning to being enabled.

17. The voltage generating circuit of claim 16 wherein the precharge circuit comprises:

a level translator circuit coupled to receive a power supply signal and to couple the power supply voltage to an output terminal in response to the program command signal; and a voltage limiting device coupled between the output terminal of the level translator circuit and the gate of the isolating transistor, the voltage limiting device being operable to couple the output terminal of the level translator circuit to the gate of the isolating transistor only as long a the voltage of the gate is below a predetermined voltage.

18. A memory device, comprising:

a command decoder receiving memory command signals through externally accessible input terminals, the command decoder generating memory control signals responsive to predetermined combinations of the command signals;

an address decoder receiving address signals through externally accessible input terminals, the address decoder generating row and column addressing signals responsive to the address signals;

at least one memory array including a plurality of memory cells arranged in rows and columns, data being written to or read from the memory cells corresponding the address signals responsive to the memory control signals;

a data path extending between a plurality of external terminals and the memory array for coupling data signals to and from the memory array;

a plurality of programmable elements that are each programmed by coupling a programming current through the respective programmable element, the programmable elements being programmed to alter the operation of the memory device; and a programming circuit for selectively either isolating the programmable elements from one of the external terminals or allowing a programming voltage to be coupled from the external terminal to the programmable elements, the programming circuit comprising:
an isolation device coupled between the external terminal and the programmable elements, the isolation device having a first terminal coupled to the external terminal, a second terminal coupled to the programmable elements, and control terminal, the isolation device being operable to couple the programming voltage applied to the external terminal to the programmable elements as long as the absolute value of the voltage coupled to the programmable elements is within a predetermined magnitude of a control voltage applied to the control terminal of the isolation device; and
a charge pump circuit having a power input coupled to the external terminal and an output terminal coupled to the control terminal of the isolation device, the charge pump circuit being coupled to receive the programming voltage applied to the external terminal and being operable in a program mode to increase the absolute value of the programming voltage in response to a program command signal to generate the control voltage, the charge pump circuit being operable in an isolation mode to generate as the control voltage a voltage having an absolute value that is substantially less than the absolute value of the programming voltage, the charge pump circuit comprising:
a capacitive device having a first lead and a second lead coupled to receive the programming voltage;
a boosting circuit repetitively driving the first lead of the capacitive device between first and second voltage levels responsive to the program command signal; and
a uni-directional current path coupling the second lead of the capacitive device to the control terminal of the isolation device.

19. The memory device of claim 18 wherein the programmable elements comprise respective anti-fuses.

20. The memory device of claim 18 wherein the memory array further comprises a plurality of redundant rows of memory cells, and wherein the programmable elements, when programmed, are operable to substitute a redundant row of memory cells for a defective row of memory cells.

21. The memory device of claim 18, further comprising a mode register containing a plurality of the programmable elements, and wherein the programmable elements, when programmed, are operable to control the operating mode of the memory device.

22. The memory device of claim 18 wherein the isolation device comprises a MOSFET transistor.

23. The memory device of claim 22 wherein the MOSFET transistor comprises an NMOS transistor.

24. The memory device of claim 18 wherein the first current path comprises a MOSFET transistor.

25. The memory device of claim 24 wherein the MOSFET transistor comprises an NMOS transistor.

26. The memory device of claim 18 wherein the second current path comprises a MOSFET transistor.

27. The memory device of claim 26 wherein the MOSFET transistor comprises an NMOS transistor.

28. The memory device of claim 18 wherein the capacitive device comprises a MOSFET transistor in which one of the first and second terminals comprises source and drain terminals of the MOSFET transistor and the other of the first and second terminals comprises a gate of the MOSFET transistor.

29. The memory device of claim 18, further comprising a precharge circuit coupled to the programming node, the precharge circuit being operable to apply a precharge voltage to the control terminal of the isolation device responsive to the charge pump circuit transitioning to being enabled.

30. The memory device of claim 18 wherein the boosting circuit comprises an oscillator applying a periodic signal to the first lead of the capacitive device responsive to the program command signal.

31. The memory device of claim 18 wherein the memory array comprises an array of dynamic random access memory cells.

32. A processor-based system, comprising:
an integrated circuit processor having a plurality of external terminals coupled to a processor bus;
an input device coupled to the processor through the processor bus adapted to allow data to be entered into the computer system;
an output device coupled to the processor through the processor bus adapted to allow data to be output from the computer system; and
an integrated circuit memory device a plurality of external terminals coupled to the processor bus, the integrated circuit memory device comprising:
a command decoder receiving memory command signals through externally accessible input terminals, the command decoder generating memory control signals responsive to predetermined combinations of the command signals;
an address decoder receiving address signals through externally accessible input terminals, the address decoder generating row and column addressing signals responsive to the address signals;
at least one memory array including a plurality of memory cells arranged in rows and columns, data being written to or read from the memory cells corresponding the address signals responsive to the memory control signals;
a data path extending between a plurality of external terminals and the memory array for coupling data signals to and from the memory array;
a plurality of programmable elements that are each programmed by coupling a programming current through the respective programmable element, the programmable elements being programmed to alter the operation of the memory device; and
a programming circuit for selectively either isolating the programmable elements from one of the external terminals or allowing a programming voltage to be coupled from the external terminal to the programmable elements, the programming circuit comprising:
an isolation device coupled between the external terminal and the programmable elements, the isolation device having a first terminal coupled to the external terminal, a second terminal coupled to the programmable elements, and control terminal, the isolation device being operable to couple the programming voltage applied to the external terminal to the programmable elements as long as the absolute value of the voltage coupled to the programmable elements is within a predetermined magnitude of a control voltage applied to the control terminal of the isolation device; and
a charge pump circuit having a power input coupled to the external terminal and an output terminal coupled to the control terminal of the isolation device, the charge pump circuit being coupled to receive the programming voltage applied to the external terminal and being operable in a program mode to increase the absolute value of the programming voltage in response to a program command signal to generate the control voltage, the charge pump circuit being operable in an isolation mode to generate as the control voltage a voltage having an absolute value that is substantially less than the absolute value of the programming voltage, the charge pump circuit comprising:
   a capacitive device having a first lead and a second lead coupled to receive the programming voltage;
   a boosting circuit repetitively driving the first lead of the capacitive device between first and second voltage levels responsive to the program command signal; and
   a uni-directional current path coupling the second lead of the capacitive device to the control terminal of the isolation device.

33. The processor-based system of claim 32 wherein the programmable elements comprise respective anti-fuses.

34. The processor-based system of claim 32 wherein the memory array further comprises a plurality of redundant rows of memory cells, and wherein the programmable elements, when programmed, are operable to substitute a redundant row of memory cells for a defective row of memory cells.

35. The processor-based system of claim 32, further comprising a mode register containing a plurality of the programmable elements, and wherein the programmable elements, when programmed, are operable to control the operating mode of the memory device.

36. The processor-based system of claim 32 wherein the isolation device comprises a MOSFET transistor.

37. The processor-based system of claim 36 wherein the MOSFET transistor comprises an NMOS transistor.

38. The processor-based system of claim 32 wherein the first current path comprises a MOSFET transistor.

39. The processor-based system of claim 38 wherein the MOSFET transistor comprises an NMOS transistor.

40. The processor-based system of claim 32 wherein the second current path comprises a MOSFET transistor.

41. The processor-based system of claim 40 wherein the MOSFET transistor comprises an NMOS transistor.

42. The processor-based system of claim 32 wherein the capacitive device comprises a MOSFET transistor in which one of the first and second terminals comprises source and drain terminals of the MOSFET transistor and the other of the first and second terminals comprises a gate of the MOSFET transistor.

43. The processor-based system of claim 32, further comprising a precharge circuit coupled to the programming node, the precharge circuit being operable to apply a precharge voltage to the control terminal of the isolation device responsive to the charge pump circuit transitioning to being enabled.

44. The processor-based system of claim 32 wherein the boosting circuit comprises an oscillator applying a periodic signal to the first lead of the capacitive device responsive to the program command signal.

45. The processor-based system of claim 32 wherein the integrated circuit memory device comprises an integrated circuit dynamic random access memory device.

46. A method of supplying a voltage to a gate of a MOSFET transistor to allow the transistor to couple a programming voltage from an external terminal of an integrated circuit to a program node to which a programming element may be coupled, the method comprising:
   coupling the programming voltage to a first lead of a capacitor
   repetitively changing a voltage applied to a second lead of the capacitor between first and second values;
   allowing a current to flow between the first lead of the capacitor and the gate of the MOSFET transistor when the voltage applied to the second lead of the capacitor has the first value; and
   preventing current from flowing between the first lead of the capacitor and the gate of the MOSFET transistor when the voltage applied to the second lead of the capacitor has the second value.

47. The method of claim 46 wherein the MOSFET transistor comprises an NMOS transistor.

48. The method of claim 46 wherein the first value of the voltage applied to the second lead of the capacitor is greater than the second value of the voltage applied to the second lead of the capacitor.

49. The method of claim 46 wherein the programming voltage comprises a positive voltage.

50. The method of claim 46, further comprising precharging the gate of the MOSFET transistor to a predetermined voltage prior to the act of repetitively changing a voltage applied to a second lead of the capacitor between first and second values.

51. A method of programming a programmable element with a programming voltage in an integrated circuit in which the programmable element is coupled to a programming node, the method comprising:
   when the programmable element is to be programmed:
      coupling an external terminal of the integrated circuit to the programming node through a switching device having a control terminal;
      coupling a programming voltage to the external terminal;
      boosting the magnitude of the programming voltage to provide a boosted programming voltage to the control terminal of the switching device, the act of boosting the magnitude of the programming voltage comprising:
         coupling the programming voltage to a first lead of a capacitor;
         repetitively changing a voltage applied to a second lead of the capacitor between first and second values; and
         allowing a current to flow between the first lead of the capacitor and the control terminal of the switching device when the voltage applied to the second lead of the capacitor has the first value; and
         preventing current from flowing between the first lead of the capacitor and the control terminal of the switching device when the voltage applied to the second lead of the capacitor has the second value; and
   when the programming element is not to be programmed, applying a voltage to the control terminal of the switching device to cause the switching device to isolate the programming node from the external terminal.

52. The method of claim 51, further comprising coupling the programming node to a predetermined voltage when the programming element is not to be programmed.

53. The method of claim 51 wherein the switching device comprises a MOSFET transistor, and wherein the control terminal of the switching device comprises a gate of the MOSFET transistor.

54. The method of claim 53 wherein the MOSFET transistor comprises an NMOS transistor.

55. The method of claim 51 wherein the first value of the voltage applied to the second lead of the capacitor is greater than the second value of the voltage applied to the second lead of the capacitor.

56. The method of claim 51 wherein the programming voltage comprises a positive voltage, and wherein the act of boosting the magnitude of the programming voltage to provide a boosted programming voltage comprises increasing the programming voltage to a larger positive voltage.

57. The method of claim 51, further comprising precharging the control terminal of the switching device to a predetermined voltage prior to the act of repetitively changing a voltage applied to a second lead of the capacitor between first and second values.

* * * * *